US010284950B2

(12) United States Patent
Napoli et al.

(10) Patent No.: US 10,284,950 B2
(45) Date of Patent: May 7, 2019

(54) SPEAKER ENCLOSURE STATUS

(71) Applicant: Cirrus Logic International Semiconductor Ltd., Edinburgh (GB)

(72) Inventors: Roberto Napoli, Milan (IT); Rong Hu, Austin, TX (US); Jie Su, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/878,976

(22) Filed: Jan. 24, 2018

(65) Prior Publication Data

US 2018/0220233 A1 Aug. 2, 2018

Related U.S. Application Data

(60) Provisional application No. 62/451,263, filed on Jan. 27, 2017.

(51) Int. Cl.

*H03G 11/00* (2006.01)
*H04R 29/00* (2006.01)
*H04R 3/00* (2006.01)

(52) U.S. Cl.

CPC ........... *H04R 3/007* (2013.01); *H04R 29/001* (2013.01); *H04R 29/003* (2013.01); *H04R 3/00* (2013.01); *H04R 29/00* (2013.01); *H04R 2499/11* (2013.01)

(58) Field of Classification Search

CPC .. H04R 3/007; H04R 29/003; H04R 2499/11; H04R 29/001; H04R 3/00; H04R 29/00

See application file for complete search history.

(56) References Cited

U.S. PATENT DOCUMENTS

2012/0288118 A1* 11/2012 Gautama ................ H04R 3/007 381/98
2018/0136899 A1* 5/2018 Risberg .................. G06F 3/165

* cited by examiner

*Primary Examiner* — Andrew L Sniezek
(74) *Attorney, Agent, or Firm* — Norton Rose Fulbright US LLP

(57) ABSTRACT

The reliability and resilience of a speaker in a portable device may be improved by enabling the device to determine a status of an enclosure of a transducer. The impedance profiles of transducers vary depending on the enclosure status, whether the enclosure is leaky, ported, or sealed. Determination of parameters related to an impedance of a transducer may aid in a determination of the status of the enclosure. Once an enclosure status is determined, that information may be used to determine an excursion model for the transducer. Adapting the excursion model or other audio processing parameters can improve protection and performance of the transducer.

23 Claims, 9 Drawing Sheets

SPEAKER ENCLOSURE STATUS

CROSS-REFERENCE TO RELATED PATENT APPLICATIONS

This application claims the benefit of priority of U.S. Provisional Patent Application No. 62/451,263 to Napoli et al. filed on Jan. 27, 2017, and entitled "Speaker Enclosure Status," which is hereby incorporated by reference in its entirety.

FIELD OF THE DISCLOSURE

The instant disclosure relates to an audio system. More specifically, portions of this disclosure relate to a method for modeling excursion of a transducer.

BACKGROUND

Portable devices are becoming more ubiquitous in every-day life. They influence how we communicate with each other, interact with our music, and organize our lives. For example, many consumers enjoy their music on portable audio players, such as MP3 players or cellular phones. Portable devices become easier and more enjoyable to use when they shrink in size while offering the same capabilities. The desire for smaller electronic devices creates a tension between requirements of small size and maintaining loud and bass-rich sound, whether from an internal micro-speaker or connected external speakers (such as headphones). Dimensions of loudspeakers in portable devices are often limited by the form factor and layout of the device itself. Furthermore, the introduction of smart accessories and modular cellular phone design has expanded the variety of speaker designs available for use with a portable electronic device. One such speaker design is a ported rear enclosure which can provide for enhanced bass.

FIGS. 1A and 1B illustrate an example of the design difference between a sealed speaker and a ported speaker. A sealed speaker, as illustrated in FIG. 1A, may include a sealed enclosure 106 around a back cavity of the speaker and a transducer 102. A ported speaker, as illustrated in FIG. 1B, may include a ported enclosure 108 around a back cavity of the speaker along with a transducer 102 and a port 104 in the enclosure. The port 104 allows air to be exchanged between the inside of the enclosure 108 and the surrounding space as illustrated in FIGS. 2A-B. In FIG. 2A, air is forced out of the enclosure 108 through port 104 as the cone moves inwards. In FIG. 2B, air is drawn into the enclosure 108 through port 104 as the cone moves outward. Thus, air may move in and out of the enclosure in accordance with movement of the cone 110 during operation of the speaker.

FIG. 3 illustrates one of the potential advantages of a ported speaker in which the bass sound pressure level (SPL) frequency response of the speaker can be extended by the addition of a properly tuned port. A line 302 illustrates frequency response for low frequencies for a ported speaker, such as that of FIG. 1B; and a line 304 illustrates frequency response for low frequencies for a sealed speaker, such as that of FIG. 1A. A resonance frequency of the port 104 creates constructive interference between the port 104 and the cone 110, such as shown below 100 Hertz in line 302, thus extending the bass frequency response of the speaker. Below the resonance frequency, the interference will be destructive, thus creating the sharp drop off, such as shown below 30 Hertz in line 302. The port 104 allows for increased bass frequency response for the same power consumption as a sealed speaker.

However, the availability of varied enclosure types has introduced design challenges. For example, the tuning or performance of speakers can be highly dependent upon the port configuration. Speaker protection may be necessary to maintain operation of the speaker within excursion and thermal limits, for example, when a boosted amplifier is used to maximize volume through overdriving the speaker. Thus, design of speakers with ported and sealed enclosures can necessitate specific tuning algorithms tailored to the specific speaker design to protect the speaker as well as to maintain high audio quality. Furthermore, the speaker sealing may change during operation of the device. For example, ports of ported speakers may become blocked during operation, such as in mobile devices where a user can unknowingly place his hand over a port causing a speaker response to appear like a sealed speaker rather than a ported speaker. Sealed speakers may develop leaks over time, causing the speaker to behave like a ported speaker rather than a sealed speaker. Thus, a fixed tuning algorithm for a speaker may be inadequate to maintain high audio quality and to protect the speaker.

Shortcomings mentioned here are only representative and are included simply to highlight that a need exists for improved electrical components, particularly for audio systems employed in consumer-level devices, such as mobile phones. Embodiments described herein address certain shortcomings but not necessarily each and every one described here or known in the art. Furthermore, embodiments described herein may present other benefits than, and be used in other applications than, those of the shortcomings described above.

SUMMARY

The reliability and resilience of a speaker in a portable device may be improved by enabling the device to determine an enclosure status of a transducer of the speaker. Determination of parameters related to an impedance of a transducer may aid in a determination of the status of the enclosure. The impedance profiles of transducers can vary depending on the status of the enclosure, whether leaky, ported, or sealed. The enclosure status may be used to determine an excursion model for the transducer based, at least in part, on the enclosure status. By selecting an appropriate excursion model for the transducer, the transducer behavior can be better predicted resulting in improved operation. For example, an appropriate excursion model can provide better speaker protection by better determining movement of the speaker in response to applied signals. As another example, an appropriate excursion model can allow the speaker to operate with smaller safety margins, thus allowing the speaker to operate at higher volumes without risking damage to the speaker. As yet another example, an appropriate excursion model can allow an equalization to be applied to the speaker to improve sound quality. In comparison, conventional excursion models are not adapted based on an enclosure status of the speaker, and thus result in unpredictable performance from the speaker.

In some embodiments, a method for operating a transducer may include receiving information regarding the transducer, such as receiving a current and/or voltage measurement from a transducer. That information may be used in determining one or more parameters related to an impedance of the transducer based, at least in part, on the current and/or voltage measurement. An enclosure status of the transducer may be determined based on the one or more parameters, and an excursion model may then be determined for the transducer based, at least in part, on the enclosure status. In some embodiments, the one or more parameters may comprise a number of peaks in an impedance curve, wherein the number of peaks indicates whether the enclosure status of the transducer is sealed or ported. Alternatively or additionally, in some embodiments, the one or more parameters may comprise a number of troughs in an admittance curve, wherein the number of troughs indicates whether the enclosure status of the transducer is sealed or ported.

In certain embodiments, the step of receiving a current measurement from a transducer may comprise receiving a first current measurement and the step of determining the one or more parameters may comprise determining a first value for the one or more parameters. In such embodiments, the method may further comprise receiving a second current measurement from the transducer; determining a second value for the one or more parameters based, at least in part, on the second current measurement; and determining a change in enclosure status based, at least in part, on a comparison of the second value for the one or more parameters and the first value for the one or more parameters. In determining the change in enclosure status, a change in a number of peaks in an impedance curve of the transducer may be determined indicating a port of the transducer is blocked.

In still other embodiments, the method may further comprise applying a speaker protection algorithm based on the determined excursion model to keep an excursion of the transducer from exceeding a predetermined limit. The method may also comprise a step of modifying an equalizer profile for audio reproduced through the transducer in accordance with the determined excursion model.

In certain embodiments, the one or more parameters may comprise a frequency of a peak in an impedance curve, and the enclosure status may be one of sealed, ported, and leaky. In other embodiments, the step of determining an enclosure status may comprise determining whether one or more parameters related to an impedance, such as a frequency of a peak of an impedance curve, have deviated from a predetermined range. In such embodiments, the predetermined range may be tailored to allow for variations in behavior of the transducer based on fluctuations in environmental factors.

According to another embodiment, an apparatus may include a transducer and a controller configured to perform steps comprising receiving a current measurement for a transducer; determining one or more parameters related to an impedance of the transducer based, at least in part, on the current measurement; determining an enclosure status of an enclosure of the transducer indicated by the one or more parameters; and determining an excursion model for the transducer based, at least in part, on the enclosure status.

According to another embodiment, an electronic device may include a transducer, a speaker monitoring circuit, configured to monitor a current of the transducer, and an audio controller, coupled to the speaker monitoring circuit and to the transducer, wherein the audio controller may be configured to perform steps comprising receiving a current measurement for the transducer; determining one or more parameters related to an impedance of the transducer based, at least in part, on the current measurement; determining an enclosure status of an enclosure of the transducer indicated by the one or more parameters; and determining an excursion model for the transducer based, at least in part, on the enclosure status.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 4:
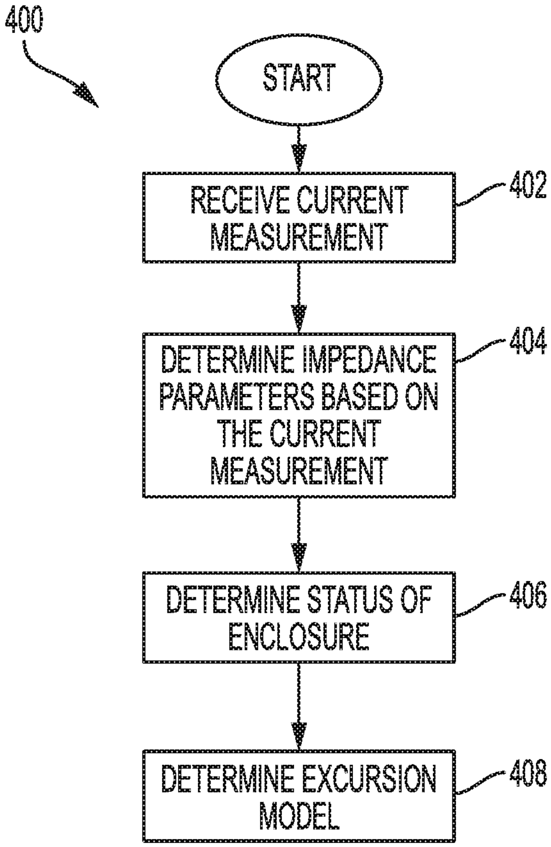
FIG. 4 is a flow chart illustrating a method for the determination of a status of an enclosure of a transducer of a speaker and an associated excursion model according to some embodiments of the disclosure.

FIG. 4 is a flow chart illustrating a method for determining enclosure characteristics of a speaker and determining an excursion profile based on the enclosure characteristics. A method 400 may begin at block 402 with receiving a current measurement for a transducer. The transducer may be a speaker of a portable electronic device. The current measurement may be obtained by monitoring a current flowing through the speaker. In some embodiments, a voltage measurement of the transducer may be additionally or alternatively obtained through monitoring a voltage across the speaker and used in determining one or more parameters related to an impedance. If a current measurement alone is used, an output signal can be fed back with an appropriate scaling and delay because the amplifier transfer function can be approximated with a linear gain. The method 400 then proceeds to block 404 where one or more parameters related to an impedance of the transducer are determined. Such a determination may be based on the current and/or the voltage measurements. One or more parameters related to an impedance may be determined, based, at least in part, on the current measurement, assuming appropriate scaling and delay of the output signal to approximate a transfer function of the speaker, assuming a known linear gain. The method 400 then proceeds to block 406 where the enclosure status is determined by analyzing the one or more parameters and determining an enclosure status based on the one or more parameters. At block 408, an excursion model for the transducer is determined based, at least in part, on the enclosure status, for example, by selecting from one of several available excursion models.

Figure 5:
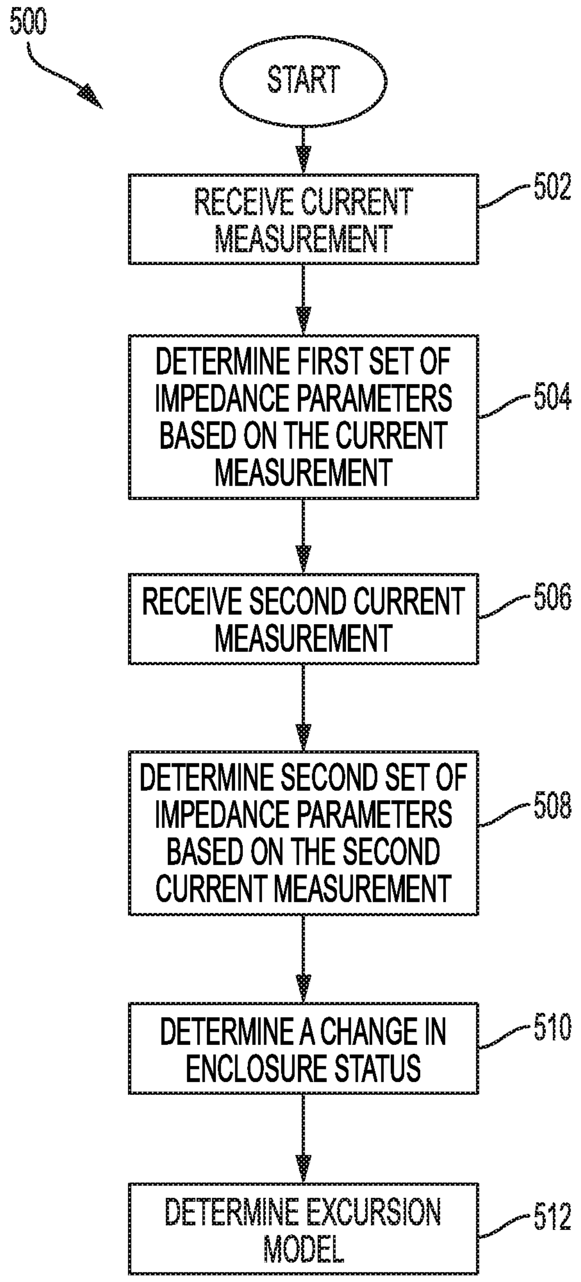
FIG. 5 is a flow chart illustrating a method for the determination of a change in status of an enclosure of a transducer of a speaker according to some embodiments of the disclosure.

In one embodiment, as illustrated in FIG. 5, a method may allow for determination of a change in enclosure status and determination of an excursion model in accordance with the changed status. A method 500 may begin at block 502 with a receipt of a first current measurement. At block 504, a determination is made as to first value for one or more parameters related to an impedance. The determination of the first value may include retrieving a preprogrammed value for the one or more parameters, which may be based on an offline measurement. For example, if a speaker production model is sealed, the first value may be based on the speaker design and stored in a memory. In another example, the first value may come from an online estimate as illustrated in block 504. A second current measurement for a later time than the first current measurement is then received at block 506. A voltage measurement of the transducer may also or alternatively be obtained and used in the determination of the first and second sets of parameters related to an impedance. At block 508, a determination is made as to second values for the one or more parameters related to an impedance based on the second current measurement. A comparison of the first values and the second values is then conducted, at block 510, to determine a change in enclosure status. An excursion model may then be determined at block 512, based, at least in part, on the enclosure status determined at block 510.

Figure 6:
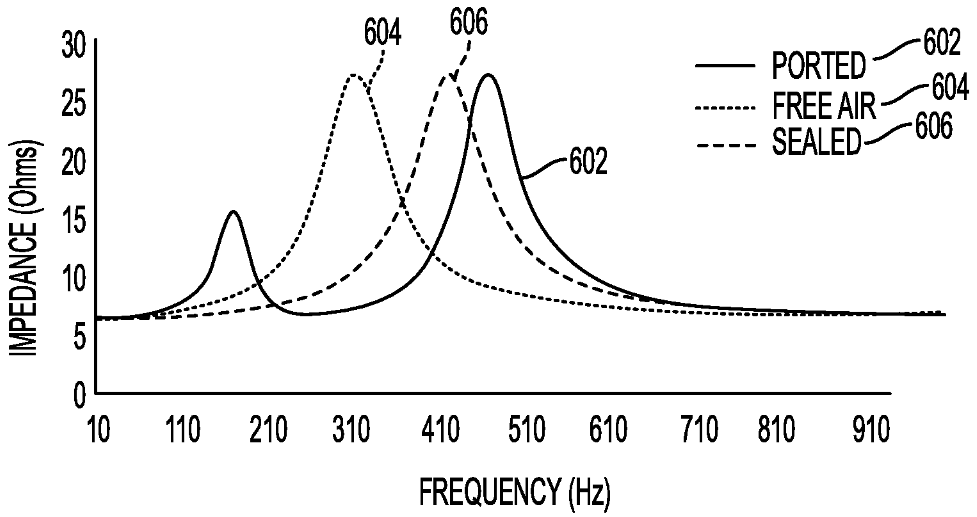
FIG. 6 is a graph illustrating the impedance curve of a ported speaker, a free air speaker, and a sealed speaker according to some embodiments of the disclosure.

Determining one or more parameters related to an impedance of the transducer may involve determining parameters that describe an impedance curve of the transducer, such peak response positions and/or peak widths in the impedance curve or admittance curve. An example impedance curve of a transducer with various enclosure statuses is illustrated in FIG. 6. An impedance curve may be constructed using measurements of current flowing through the speaker. A voltage across the speaker may also or alternatively be monitored and used to construct the curve. Although an impedance curve is described, parameters of other curves related to an impedance of the transducer, such as an admittance curve, may be alternatively or additionally used to describe a transducer. In some embodiments, the one or more parameters may be measurements of response across a range of frequencies that can be used to reconstruct the impedance curve. The constructed impedance curve may range from direct-current (DC) to a value greater than a highest resonance peak of a transducer, which may be located between 500 Hz and 1 kHz in some microspeakers. In some cases, the current measurement may be downsampled to reduce the computational costs of providing an accurate impedance curve. In some embodiments, the one or more parameters may be extracted from the reconstructed impedance curve. Construction of an impedance curve and extraction of parameters may also be performed during an offline characterization phase of the transducer, and parameters may be stored in a memory for future reference.

The one or more parameters related to an impedance may include a number of peaks in an impedance curve. Alternatively or additionally, the one or more parameters related to an impedance may include a number of troughs or peaks in an admittance curve. FIG. 6 illustrates the change in impedance of different enclosure states of a transducer with respect to frequency according to some embodiments of the disclosure. Plot 602 shows the impedance curve of a transducer with a ported enclosure. Plot 602 contains two impedance resonance peaks at approximately 165 Hz for the port and 470 Hz for the transducer. Plot 604 shows an impedance curve of a free air transducer, containing one impedance peak at approximately 315 Hz. Plot 606 shows an impedance curve of a transducer with a sealed enclosure, containing a single impedance peak at approximately 415 Hz. Because the impedance curve of a transducer with a ported enclosure contains two peaks while the impedance curve of a transducer with a sealed enclosure contains a single peak, it is possible for the number of impedance peaks to indicate whether a transducer enclosure is sealed or ported. Therefore, an enclosure status of the transducer may be determined by detecting a number of peaks of an impedance curve of the transducer.

Other parameters may also be used to determine the enclosure status based on the example plots of FIG. 6. For example, the one or more parameters may include a frequency or impedance of a peak in an impedance curve. As another example, the one or more parameters may include a frequency or impedance of a trough of an impedance curve. Alternatively or additionally, the one or more parameters related to an impedance may include a frequency or admittance of a peak or trough of an admittance curve. As illustrated in FIG. 6, various speaker enclosure profiles exhibit impedance peaks at varying frequencies. Thus, an enclosure status may be indicated by a frequency of a peak of the impedance curve. Furthermore, changes in enclosure status may also be indicated by a change in a frequency or impedance of a peak of an impedance curve. Alterations in enclosure status, such as blockage of a port or development of a leak, may affect the frequency and impedance of a peak of the impedance curve.

The determination of the excursion model for the transducer based on the enclosure status may use a variety of models. For example, the Thiele-Small model, which involves separate models for ported and sealed enclosure speakers may be used to estimate an excursion profile. As another example, an approach using motional feedback to estimate a velocity of the cone 110 to derive displacement may be used. In still other embodiments, more complex non-linear speaker models may be used. In such embodiments, parameters may be extracted from the impedance curve that allow for creation of an excursion model using the Thiele-Small model or another model.

One example excursion model determination process may use the Thiele-Small model as a default excursion model. If the enclosure is determined to be ported, a Thiele-Small excursion model may be loaded that corresponds to a ported speaker. If the enclosure is determined to be sealed, a Thiele-Small excursion model may be loaded that corresponds to a sealed enclosure. If a change in enclosure status is determined, an excursion model may be switched to one that corresponds to a current enclosure status of the transducer. In order to obtain a more accurate excursion model, parameters extracted from an impedance curve may be used in forming the Thiele-Small model.

An excursion model may also be determined based on other information. For example, motional feedback may be used to estimate a velocity of the cone 104 in order to determine an excursion model. Some parameters, for such a model, may be extracted from the impedance curve, while others, such as the force factor, may not be. However, a force factor value may be associated with an enclosure status of the speaker, such as sealed, leaky, or ported. Therefore, a force factor value based on a determined enclosure status and other parameters, such as peak impedance and frequency, may be used to arrive at a more accurate excursion model.

The determination of an excursion model may be limited to certain excursion models, such as only excursion models of ported speakers. In such cases, an excursion profile may remain unaltered when a change in enclosure status occurs. Instead, when an enclosure status other than ported, for example, is detected, a gain of the speaker may be reduced and limited in order to prevent an excursion from exceeding a predetermined limit. A root-mean-square (RMS) limiter may also or alternatively be used to ensure that an excursion does not exceed maximum tolerances. Such operation may be applied when accurate excursion modeling is difficult or impossible, in order to prevent damage to the speaker. Such limiting may also be implemented when a speaker is transitioning from a first excursion model to a second excursion model, due to a change in an enclosure status of a transducer.

Figure 7A:
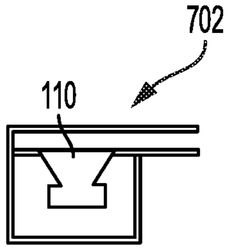
FIGS. 7A-B are illustrations of a comparison of a speaker with a sealed enclosure and a front port leading to a cone of a transducer and a speaker with a sealed enclosure and a front port leading to a cone of the transducer according to some embodiments of the disclosure.
Figure 7B:
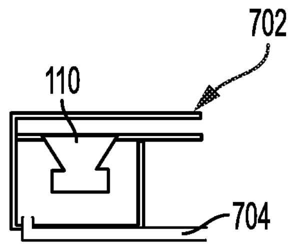

The enclosure status of a transducer may be determined to be different types of ported speakers. FIG. 7A and FIG. 7B illustrate examples speakers with two kinds of enclosures. As shown in FIG. 7A, an enclosure of a transducer may be sealed, having only a front port 702 leading to the cone 110. As shown in FIG. 7B, an enclosure of a transducer may be ported, having a port in the enclosure at the back 704 and port leading to the cone 110 at the front 702. The determination of enclosure status described herein and with reference to blocks 406 and 510 may include determination of a presence of a port in the enclosure of a transducer, a number of ports in an enclosure of a transducer, a blockage level of a port in an enclosure of a transducer, and a blockage level of a front port leading to a cone 110 or a blockage level of the cone 110 itself if the front of the cone is open as illustrated in FIGS. 1A-B and FIGS. 2A-B.

Figure 8:
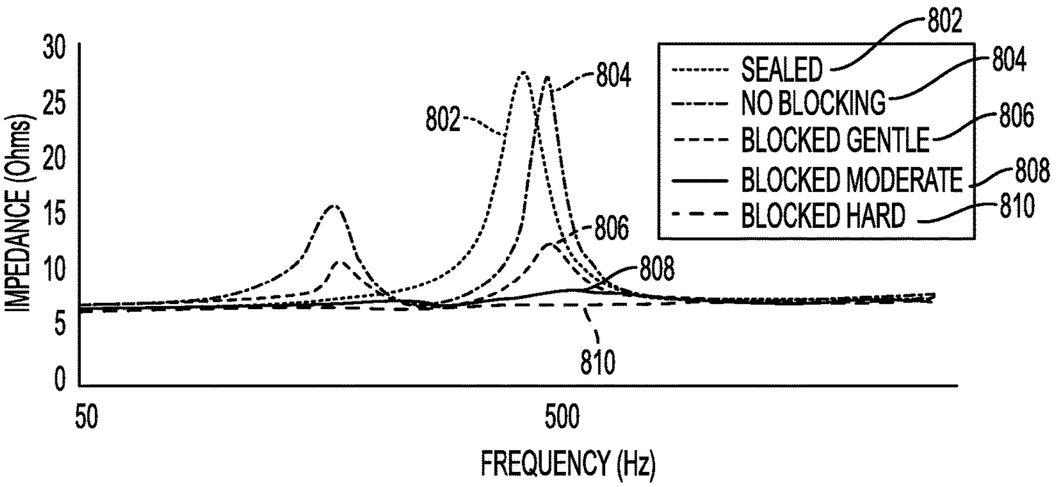
FIG. 8 is an illustration of the impedance frequency response of a ported speaker under various conditions of port blockage according to some embodiments of the disclosure.

The enclosure status of a transducer may be determined to be one of various blocked conditions. Example impedance curves for some blocked conditions are shown in FIG. 8. FIG. 8 illustrates impedance curves of a speaker with a ported enclosure under various blockage conditions. Plot 804 illustrates an impedance curve of a speaker with a ported enclosure with no blockage. As discussed above, the plot shows two peaks characteristic of a ported speaker. Plot 802 illustrates an impedance curve of a ported speaker with a blocked port in the rear enclosure. Due to the blockage, the plot 802 has only a single peak similar to a sealed speaker, and the frequency of the peak impedance has decreased slightly. Plots 806, 808, and 810 illustrate a ported speaker having a front port 702 gently blocked, moderately blocked, and substantially blocked, respectively. The peak impedances of the speaker with the ported enclosure decrease with increasing blockage of the front port. A speaker with a sealed enclosure, such as the speaker illustrated in FIG. 7A, may exhibit similar behavior when a front port of the speaker leading to a cone 110 is blocked. In some embodiments, such as the speakers illustrated in FIGS. 1A-B and FIGS. 2A-B, the cone 110 is open to the external environment with no port leading to the cone and similar effects may be observed. Thus, in some embodiments, determining a status of an enclosure of the transducer may involve determining a blockage level of a cone 110 of the speaker in addition to or instead of determining a status of a rear enclosure of the transducer.

Figure 9:
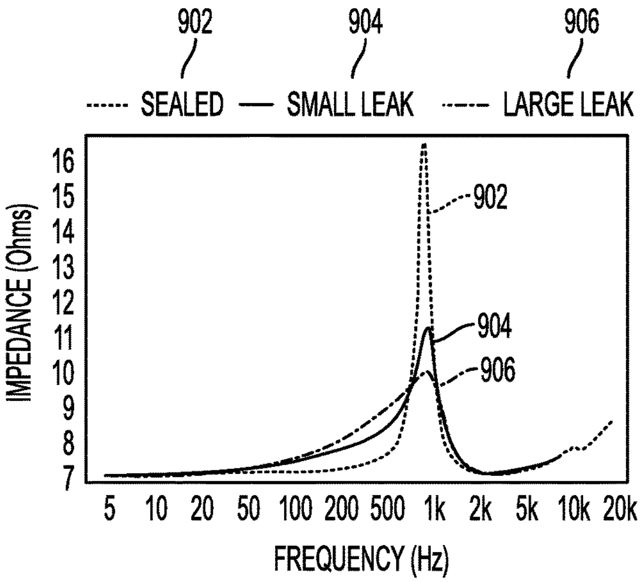
FIG. 9 is an illustration of an impedance frequency response of a sealed speaker under various different conditions of port leakage according to some embodiments of the disclosure.

A speaker with a sealed enclosure may develop a leak in the enclosure. Such a leak may cause the transducer to exhibit changes in its impedance profile, as illustrated in the examples of FIG. 9. A sealed speaker with no leaks may have an impedance curve 902 with a peak higher than a peak of an impedance curve 904 of a sealed speaker with a small leak in the enclosure. A sealed speaker with a large leak in the enclosure may have a peak of an impedance curve 906 that is still lower. As the leak becomes greater and the peak impedance decreases the impedance below the peak may increase at the resonance frequency of the transducer operating in free air, creating a more and more gradual slope trending towards DC. Thus, development of leaks in the enclosure may be detected by monitoring an impedance at the resonant frequency of the sealed enclosure speaker and the resonant frequency of the speaker in free air. Thus, determining a change in enclosure status may include determining a change in a level of blockage of a speaker indicated by a change in an impedance or a frequency of a peak of an impedance curve. Determining a change in enclosure status may also include determining a change in a level of leakiness which may also be indicated by a change in an impedance or a frequency of a peak of an impedance curve. Subsequently, an excursion model may be determined based on any blockage of the ports or leakage from the seals of the transducer.

Figure 10:
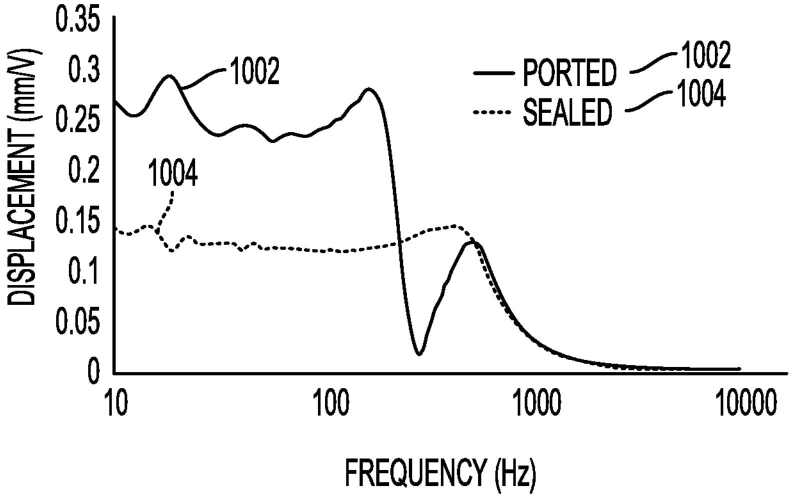
FIG. 10 is a graph of the excursion of a ported speaker over a frequency spectrum compared with the excursion of a sealed speaker over a frequency spectrum according to some embodiments of the disclosure.

The determined excursion model may be used as part of a speaker protection algorithm to keep an excursion of the transducer from exceeding a predetermined limit. FIG. 10 is a graph illustrating example excursions of a transducer of ported and sealed enclosure speakers. Cone displacement or excursion can be representative of the movement of the cone of the speaker from a rest state during operation. Plot 1004 shows an excursion profile of a sealed speaker, and plot 1002 shows an excursion profile of a speaker with a ported enclosure. Some transducers may include an enclosure having a port that may be opened or closed to change the speaker response. Plot 1002 illustrates that a ported speaker may exhibit a substantial drop in excursion around a resonant frequency of the port, in this example at approximately 250 Hz. Below the resonant frequency, however, excursion of a ported speaker, as illustrated in plot 1002, may be far greater than excursion of a sealed speaker, as illustrated in plot 1004. This is a result of the port unloading the cone and allowing for significantly greater cone displacement below the resonant frequency of the port than is present in a sealed speaker. Therefore, a sealed enclosure may exhibit an excursion profile 1004 with a single peak, and a ported enclosure may exhibit an excursion profile 1002 with two peaks and a null. These characteristics may be identified through one or more parameters relating to the impedance curve shown in plots 1002 and 1004 and used to determine an enclosure status and determine an excursion model.

Figure 11:
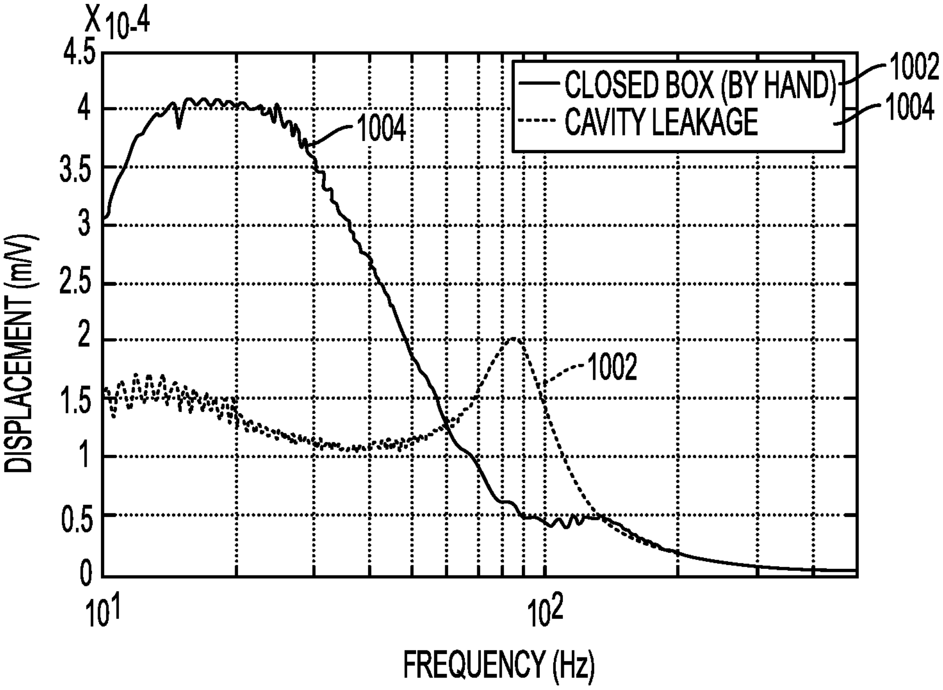
FIG. 11 is a graph illustrating the effects of cavity leakage on the excursion profile of a sealed speaker according to some embodiments of the disclosure.

The determined enclosure status may also be used to determine an appropriate excursion model based on changes in the speaker resulting from leaks in the speaker seal. FIG. 11 illustrates a plot 1102 for a sealed speaker and a plot 1104 for a sealed speaker developing a hole in its enclosure. An enclosure may become leaky through damage to the speaker, such as development of cracks or holes in the surface. Thus, characteristics of the speaker, excursion profiles in particular, can be substantially altered. Variations in excursion can have a substantial impact on audio quality, and excursion beyond certain tolerances may even damage the speaker in cases where an improper speaker protection algorithm, such as one tailored to a set of speaker parameters or speaker model other than the one present, is implemented. To avoid or limit possible harmful excursion levels resulting from an incorrect or unknown enclosure status, a speaker protection algorithm may be applied based on a determined excursion model to keep an excursion of the transducer from exceeding a predetermined limit. The predetermined limit may be a physical limit of excursion tolerance of the speaker, such as a certain number of millimeters. To prevent a speaker from being damaged based on excessive excursion, such an algorithm may be implemented depending on an enclosure status determined at least in part based on one or more parameters related to an impedance profile of the speaker. For example, an algorithm may be tailored to adjust for an enclosure status of sealed, ported, or leaky to maintain excursion of the transducer below a predetermined limit. Thus, in such an embodiment, the speaker may be protected from harmful excursion.

Figure 12:
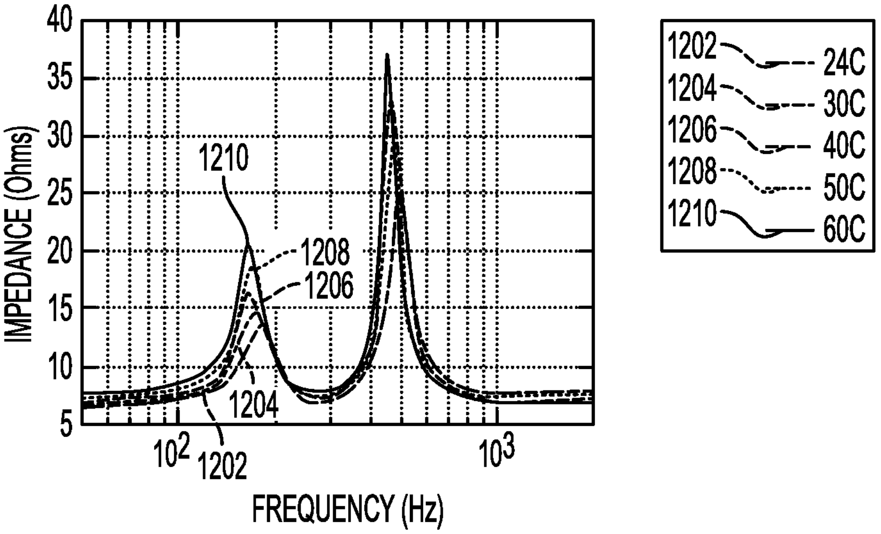
FIG. 12 is an illustration of variations in impedance frequency response of a ported speaker with variations in temperature according to some embodiments of the disclosure.
Figure 13:
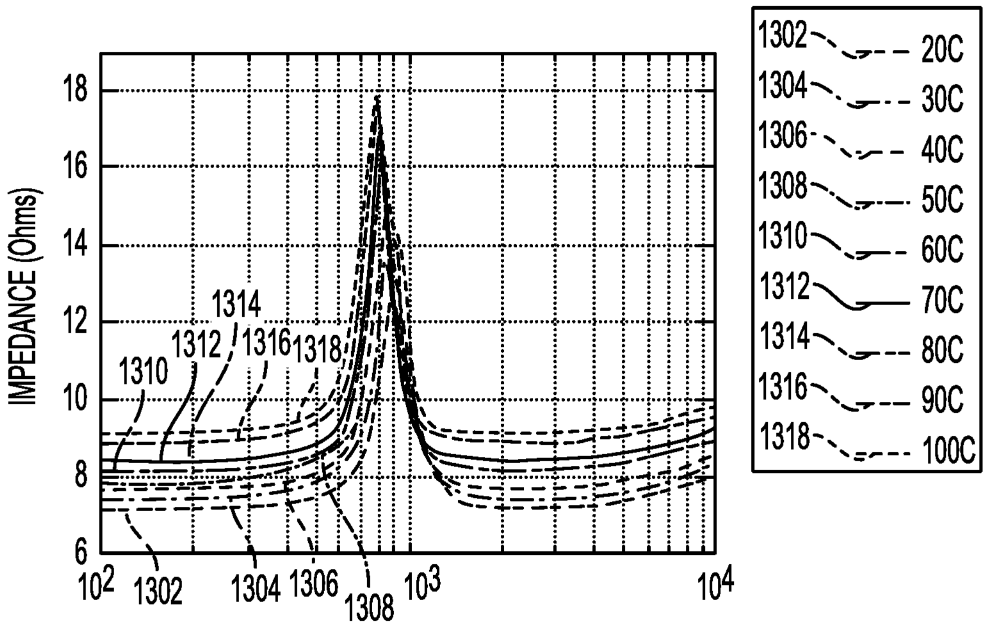
FIG. 13 is an illustration of variations in impedance frequency response of a sealed speaker with variations in temperature according to some embodiments of the disclosure.

A peak frequency and impedance of an impedance curve may vary over the course of normal use, even without a change in enclosure status, but may also vary due to manufacturing tolerances, temperature variation, and aging, each of which may be measured and/or calibrated out during operation. FIG. 12 is a graph illustrating potential variations in impedance peak amplitude and frequency of a ported speaker depending on a temperature of the speaker. Lines 1202, 1204, 1206, 1208, and 1210 show impedance curves at temperatures of 24, 30, 40, 50, and 60 degrees Celsius, respectively. FIG. 13 is a graph illustrating the same effect, present in a speaker with a sealed enclosure. Line 1302, 1304, 1306, 1308, 1310, 1312, 1314, 1316, and 1318 show impedance curves at temperatures of 20, 30, 40, 50, 60, 70, 80, 90, and 100 degrees Celsius, respectively. Ranges may be established for the one or more parameters when determining enclosure status to prevent incorrect determinations regarding enclosure status. For example, the step of determining an enclosure status may comprise determining whether one or more parameters related to an impedance have deviated from a predetermined range.

Figure 14:
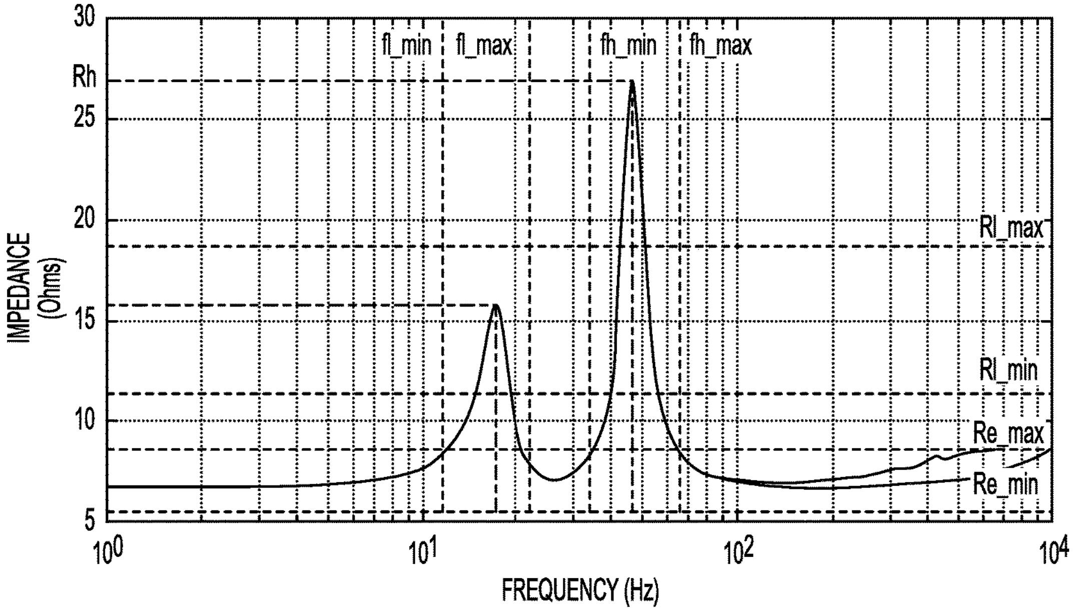
FIG. 14 is an illustration of an impedance frequency response of a ported speaker along with potential tolerances for variation in environmental conditions according to some embodiments of the disclosure.

FIG. 14 is a graph illustrating an impedance profile of a ported speaker. In such cases, the one or more parameters may include a low peak frequency, fl, a high peak frequency, fh, a low peak impedance Rl, and a high peak impedance, Rh. In such cases, the step of determining may include determining whether any of the values for the one or more parameters has moved outside of a predetermined range. For example, an enclosure status indicating that a speaker enclosure is ported may require that fl be located between fl_min and fl_max and that fh be located between fh_min and fh_max. Furthermore, a determination of such an enclosure status may also require that Rl be located between Rl_max and Rl_min in addition to Rh being located in a specified range between Rh_max and Rh_min. Similar range conditions may be applied with respect to determining an enclosure status indicating that a speaker enclosure is sealed or leaky or a level of blockage of a cone of the transducer. For example, if Rl dropped below Rl_min, a port may have been blocked and the speaker may be acting as one with a sealed enclosure. Thus, in some embodiments, a direction of change in parameters may be monitored in order to more accurately determine an enclosure status of the transducer for determination of an accurate excursion model. Thus, if Rl decreases while fh decreases, it may be possible that a port is being blocked. The potential ranges for impedance and frequency values of peaks of the impedance curve may be tailored to allow for fluctuations in environmental conditions of the speaker over the course of normal use, such as variations in temperature as illustrated in FIGS. 12 and 13. The potential ranges for impedance and frequency values of peaks of the impedance curve may also be tailored to allow for other factors, such as variations in the material of the transducer, the size of the enclosure, ageing of the speaker, and variations in production within certain tolerances.

The ranges of the parameters may be selected based on specific characteristics of the speaker. For example, if a speaker is ported and the port is expected to frequently be blocked, the ranges may be narrowly tailored to allow for quick detection of changes in the status of the enclosure because the enclosure status is expected to change frequently. If a speaker is sealed, the ranges may be more widely tailored because changes in enclosure status are not expected outside of the development of leaks in the enclosure through damage to the speaker. In such cases, variations in enclosure status would be permanent and detection without error may be more desirable than rapid detection of altered enclosure status.

Figure 1A:
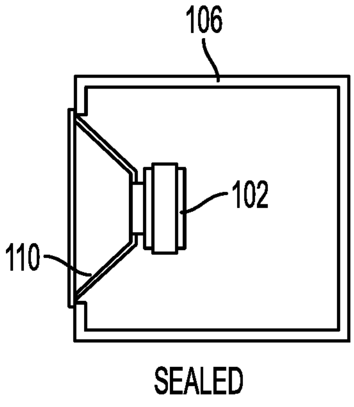
FIG. 1A PRIOR ART
FIGS. 1A-B are a comparison of a speaker with a sealed enclosure and a speaker with a ported enclosure.
Figure 1B:
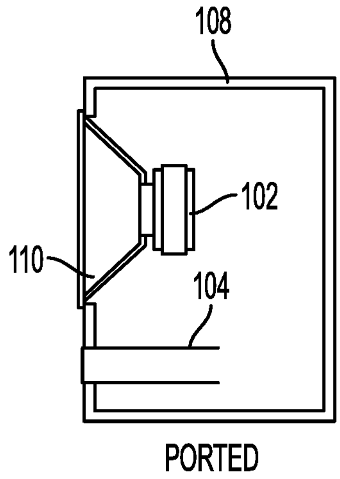
FIG. 1B PRIOR ART
Figure 2A:
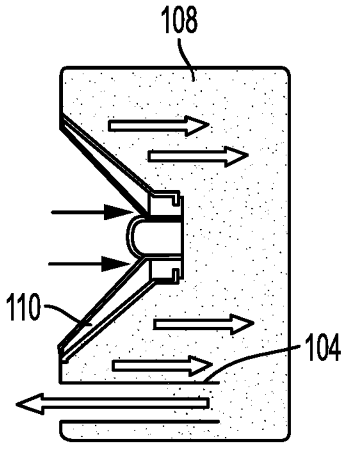
FIG. 2A PRIOR ART
FIGS. 2A-B are illustrations of the airflow inside and outside of a ported speaker.
Figure 2B:
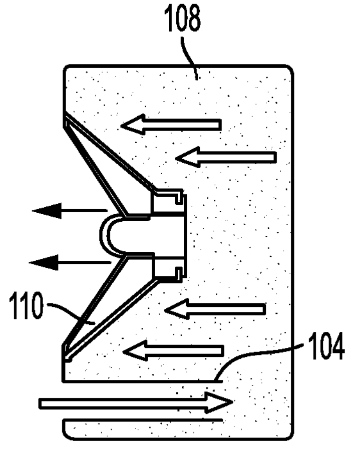
FIG. 2B PRIOR ART
Figure 3:
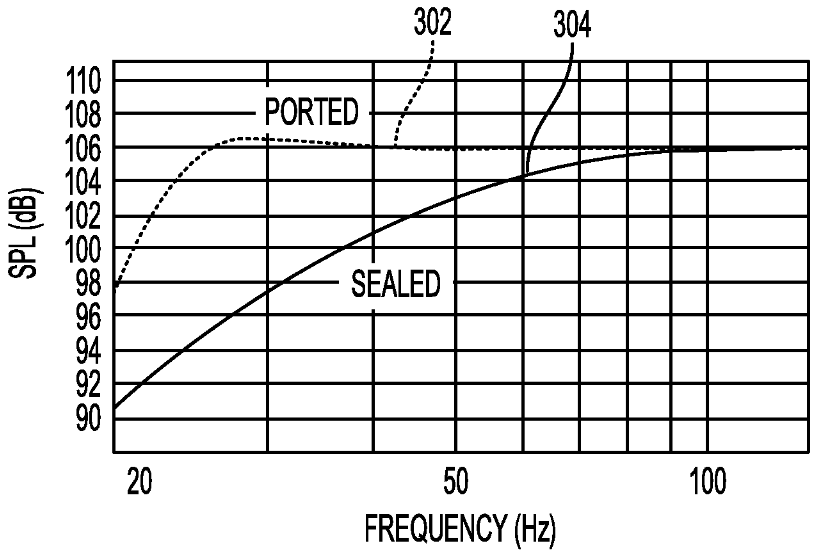
FIG. 3 PRIOR ART
FIG. 3 is a graph illustrating the bass frequency response of a ported speaker and a sealed speaker.
Figure 15:
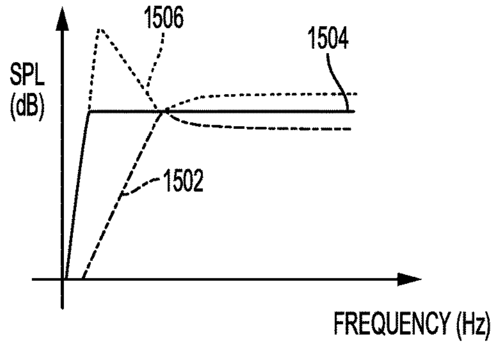
FIG. 15 is an illustration of the effect of an equalizer on speaker output according to some embodiments of the disclosure.

An equalizer profile for audio reproduced through the transducer may be adjusted in accordance with the determined excursion model. For example, high-pass filters used to filter an audio signal to be reproduced through the transducer may be modified based on the determined excursion model. As discussed above, the enclosure status of a speaker may also affect the quality of audio produced. A range of frequencies and the SPL response that a speaker can emit may differ depending on whether the speaker is ported or sealed, as illustrated in FIG. 3. In some embodiments, the equalizer profile may be modified to flatten the sound pressure level (SPL) response of the speaker in order to enhance audio quality. As illustrated in FIG. 15, a high pass filter and equalization response 1506 can be combined with a speaker's natural response 1502 to achieve a flat equalized output response 1504, thereby enhancing audio quality. In some embodiments, the high pass filter may have a corner frequency of 50 Hz, a shelving filter may boost frequencies below 200 Hz, and a notch filter may be configured to attenuate port resonance at 300 Hz. When combined with a natural response of a speaker, a flat SPL response may be achieved starting around 75 Hz. If a port of such a speaker was blocked, the natural response would change, and the equalization described above and illustrated in FIG. 15 would not provide the desired flat response. Thus, an equalizer profile may be modified in accordance with the determined excursion model. In some embodiments, modifying an equalizer profile may include altering the equalization profile to maintain the flat response that would be present if the enclosure were ported. This can be achieved by altering notch filers and increasing the low frequency boost of the shelving filter to compensate for an absence of a port resonance. In other embodiments, the equalization profile may be modified to become more optimal for the protection of the sealed speaker. This may be accomplished by increasing the corner frequency of the high pass filter to, for example, 200 Hz, saving power that would be wasted attempting to produce frequencies below the range of the speaker, reducing heat generation, and reducing cone excursion. In still other embodiments, the two methods above may be combined to achieve a preferred balance between audio quality and speaker protection and power consumption. Such methods could also be used to modify an equalizer profile in the case of a formerly sealed speaker developing a leak or becoming ported or a cone of a speaker being placed under various levels of blockage.

In another embodiment, an apparatus may include a transducer and a controller. The controller may receive a current measurement for a transducer. It may then determine one or more parameters related to an impedance of the transducer based, at least in part, on the current measurement. After the parameters have been determined, it may determine an enclosure status of an enclosure of the transducer indicated by the one or more parameters. Then, it may determine an excursion model for the transducer based on the enclosure status. In some embodiments, the controller may be designed to allow for selection of ranges for parameters based on the design of the enclosure of the transducer.

In still another embodiment, an electronic device may consist of a transducer, a speaker monitoring circuit, and an audio controller coupled to the speaker monitoring circuit and the transducer. The speaker monitoring circuit may be configured to monitor a current of the transducer. In some embodiments, the electronic device may be a microspeaker located in a portable electronic device. The audio controller may be configured to receive a current measurement from the transducer and to determine one or more parameters related to an impedance of the transducer based, at least in part, on the current measurement. Such parameters may include a number of peaks of an impedance curve or an impedance or frequency of a peak of an impedance curve. Once the parameters have been determined, an enclosure status of an enclosure of the transducer indicated by the one or more parameters may be determined. An excursion model for the transducer may then be selected based on the enclosure status.

The schematic flow chart diagrams of FIGS. 4 and 5 are generally set forth as logical flow chart diagrams. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

The operations described above as performed by a controller may be performed by any circuit configured to perform the described operations. Such a circuit may be an integrated circuit (IC) constructed on a semiconductor substrate and include logic circuitry, such as transistors configured as logic gates, and memory circuitry, such as transistors and capacitors configured as dynamic random access memory (DRAM), electronically programmable read-only memory (EPROM), or other memory devices. The logic circuitry may be configured through hard-wire connections or through programming by instructions contained in firmware. Further, the logic circuitry may be configured as a general purpose processor capable of executing instructions contained in software. In some embodiments, the integrated circuit (IC) that is the controller may include other functionality. For example, the controller IC may include an audio coder/decoder (CODEC) along with circuitry for performing the functions described herein. Such an IC is one example of an audio controller. Other audio functionality may be additionally or alternatively integrated with the IC circuitry described herein to form an audio controller.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method, comprising:

receiving a current measurement for a transducer;

determining one or more parameters related to an impedance of the transducer based, at least in part, on the current measurement;

determining an enclosure status of an enclosure of the transducer indicated by the one or more parameters, wherein determining an enclosure status comprises determining whether the one or more parameters related to an impedance have deviated from a predetermined range;

determining an excursion model for the transducer based, at least in part, on the enclosure status, wherein the one or more parameters comprise a number of peaks in an impedance curve, and wherein the number of peaks indicates whether the enclosure status of the enclosure of the transducer is sealed or ported.

2. The method of claim 1, wherein the step of receiving a current measurement comprises receiving a first current measurement, the step of determining one of more parameters comprises determining a first value for the one or more parameters, and the method further comprises:

receiving a second current measurement for the transducer;

determining a second value for the one or more parameters based, at least in part, on the second current measurement; and determining a change in enclosure status based, at least in part, on a comparison of the second value for the one or more parameters and the first value for the one or more parameters.

3. The method of claim 2, wherein the step of determining the change in enclosure status comprises determining a change in a number of peaks in an impedance curve of the transducer indicating a port of the transducer is blocked.

4. The method of claim 1, further comprising applying a speaker protection algorithm based on the determined excursion model to restrict an excursion of the transducer from exceeding a predetermined limit.

5. The method of claim 1, further comprising modifying an equalizer profile for audio reproduced through the transducer in accordance with the determined excursion model.

6. The method of claim 1, wherein the one or more parameters comprise a frequency of a peak in an impedance curve.

7. The method of claim 1, wherein the enclosure status is one of sealed, ported, and leaky.

8. The method of claim 1, wherein the predetermined range allows for variations in behavior of the transducer based on fluctuations in environmental factors.

9. The method of claim 1, wherein the one or more parameters comprise a number of troughs of an admittance curve, wherein the number of troughs indicates whether the enclosure status of the enclosure of the transducer is sealed or ported.

10. An apparatus, comprising:

a transducer; and a controller configured to perform steps comprising:

receiving a current measurement for a transducer;

determining one or more parameters related to an impedance of the transducer based, at least in part, on the current measurement;

determining an enclosure status of an enclosure of the transducer indicated by the one or more parameters, wherein determining an enclosure status comprises determining whether the one or more parameters related to an impedance have deviated from a predetermined range; and determining an excursion model for the transducer based, at least in part, on the enclosure status, wherein the one or more parameters comprise a number of peaks in an impedance curve, and wherein the number of peaks indicates whether the enclosure status of the enclosure of the transducer is sealed or ported.

11. The apparatus of claim 10, wherein the step of receiving a current measurement comprises receiving a first current measurement, the step of determining one of more parameters comprises determining a first value for the one or more parameters, and the method further comprises:

receiving a second current measurement for the transducer;

determining a second value for the one or more parameters based, at least in part, on the second current measurement; and determining a change in enclosure status based, at least in part, on a comparison of the second value for the one or more parameters and the first value for the one or more parameters.

12. The apparatus of claim 11, wherein the step of determining the change in enclosure status comprises determining a change in a number of peaks in an impedance curve of the transducer indicating a port of the transducer is blocked.

13. The apparatus of claim 10, wherein the controller is further configured to apply a speaker protection algorithm based on the determined excursion model to restrict an excursion of the transducer from exceeding a predetermined limit.

14. The apparatus of claim 10, further comprising modifying an equalizer profile for audio reproduced through the transducer in accordance with the determined excursion model.

15. The method of claim 10, wherein the one or more parameters comprise a frequency of a peak in an impedance curve.

16. The apparatus of claim 10, wherein the enclosure status is one of sealed, ported, and leaky.

17. The apparatus of claim 10, wherein the predetermined range allows for variations in behavior of the transducer based on fluctuations in environmental factors.

18. An electronic device, comprising:

a transducer;

a speaker monitoring circuit configured to monitor a current of the transducer; and an audio controller, coupled to the speaker monitoring circuit and to the transducer, wherein the audio controller is configured to perform steps comprising:

receiving a current measurement for a transducer;

determining one or more parameters related to an impedance of the transducer based, at least in part, on the current measurement;

determining an enclosure status of an enclosure of the transducer indicated by the one or more parameters, wherein determining an enclosure status comprises determining whether one or more parameters related to an impedance have deviated from a predetermined range; and determining an excursion model for the transducer based, at least in part, on the enclosure status, wherein the one or more parameters comprise a number of peaks in an impedance curve, and wherein the number of peaks indicates whether the enclosure status of the enclosure of the transducer is sealed or ported.

19. The electronic device of claim 18, wherein the step of receiving a current measurement comprises receiving a first current measurement, the step of determining one of more parameters comprises determining a first value for the one or more parameters, and the method further comprises:

receiving a second current measurement for the transducer;

determining a second value for the one or more parameters based, at least in part, on the second current measurement; and determining a change in enclosure status based, at least in part, on a comparison of the second value for the one or more parameters and the first value for the one or more parameters.

20. The electronic device of claim 19, wherein the step of determining the change in enclosure status comprises determining a change in a number of peaks in an impedance curve of the transducer indicating a port of the transducer is blocked.

21. The electronic device of claim 18, wherein the audio controller is further configured to apply a speaker protection algorithm based on the determined excursion model to keep an excursion of the transducer from exceeding a predetermined limit.

22. The electronic device of claim 18, wherein the audio controller is further configured to perform the step of modifying an equalizer profile for audio reproduced through the transducer in accordance with the determined excursion model.

23. The electronic device of claim 18, wherein the predetermined range allows for variations in behavior of the transducer based on fluctuations in environmental factors.

* * * * *